(12) United States Patent
Yao et al.

(10) Patent No.: US 8,716,665 B2
(45) Date of Patent: May 6, 2014

(54) COMPACT OPTICAL PROXIMITY SENSOR WITH BALL GRID ARRAY AND WINDOWED SUBSTRATE

(75) Inventors: Yufeng Yao, Singapore (SG); Chi Boon Ong, Singapore (SG); Wee Sin Tan, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 653 days.

(21) Appl. No.: 12/557,438

(22) Filed: Sep. 10, 2009

(65) Prior Publication Data

US 2011/0057108 A1 Mar. 10, 2011

(51) Int. Cl.
- *G01J 5/00* (2006.01)
- *G01J 5/02* (2006.01)
- *G01J 5/04* (2006.01)

(52) U.S. Cl.
USPC ................. 250/338.1; 250/339.06; 250/341.1

(58) Field of Classification Search
USPC ................. 250/336.1, 338.1, 339.01, 339.02, 250/339.06, 339.11, 338.4, 340, 341.1, 342, 250/201.1, 341.8; 340/600; 438/55, 57, 64, 438/65, 66, 70, 98, 26, 25; 257/100, 433, 257/435, 436; 396/439
See application file for complete search history.

(56) References Cited

U.S. PATENT DOCUMENTS

| | | | |
|---|---|---|---|
| 5,155,777 A | 10/1992 | Angelopoulos et al. | |
| 5,367,393 A | 11/1994 | Ohara et al. | |
| 5,567,953 A | 10/1996 | Horinouchi et al. | |
| 5,675,143 A | 10/1997 | Heimlicher | |
| 5,760,390 A | 6/1998 | Vezzalini et al. | |
| 5,811,797 A | 9/1998 | Kobachi et al. | |
| 6,064,062 A | 5/2000 | Bohn | |
| 6,135,816 A | 10/2000 | Mashiyama et al. | |
| 6,180,881 B1 * | 1/2001 | Isaak ............................. | 174/524 |
| 6,364,706 B1 | 4/2002 | Ando et al. | |
| 6,572,410 B1 | 6/2003 | Volstorf et al. | |

(Continued)

FOREIGN PATENT DOCUMENTS

| | | |
|---|---|---|
| CN | 1743886 | 8/2006 |
| CN | 1832217 | 9/2006 |

(Continued)

OTHER PUBLICATIONS

Agilent HSDL-D100 Miniature Surface-Mount Proximity Sensor Data Sheet, In current form on Dec. 21, 2007.

(Continued)

*Primary Examiner* — David Porta
*Assistant Examiner* — Yara Green (57) ABSTRACT

Various embodiments of a compact optical proximity sensor with a ball grid array and windowed or apertured substrate are disclosed. In one embodiment, the optical proximity sensor comprises a printed circuit board ("PCB") substrate comprising an aperture and a lower surface having electrical contacts disposed thereon, an infrared light emitter and an infrared light detector mounted on an upper surface of the substrate, an integrated circuit located at least partially within the aperture, a molding compound being disposed between portions of the integrated circuit and substrate, an ambient light detector mounted on an upper surface of the integrated circuit, first and second molded infrared light pass components disposed over and covering the infrared light emitter and the infrared light detector, respectively, and a molded infrared light cut component disposed between and over portions of the first and second infrared light pass components.

26 Claims, 8 Drawing Sheets

(56) References Cited

U.S. PATENT DOCUMENTS

| | | | |
|---|---|---|---|
| 6,635,955 B2 | 10/2003 | Scheidle | |
| 6,674,653 B1 | 1/2004 | Valentine | |
| 6,677,934 B1 | 1/2004 | Blanchard | |
| 6,740,862 B2 | 5/2004 | Paritsky et al. | |
| 6,771,671 B1 | 8/2004 | Fields et al. | |
| 6,855,933 B2 | 2/2005 | Stone et al. | |
| 6,885,300 B1 | 4/2005 | Johnston et al. | |
| 7,026,710 B2 | 4/2006 | Coyle et al. | |
| 7,172,126 B2 | 2/2007 | Schmidt et al. | |
| 7,229,295 B2 | 6/2007 | Ice et al. | |
| 7,256,483 B2 | 8/2007 | Eppler et al. | |
| 7,258,264 B2 | 8/2007 | Ice et al. | |
| 7,277,012 B2 | 10/2007 | Johnston et al. | |
| 7,289,142 B2 | 10/2007 | Silverbrook | |
| 7,348,536 B2 | 3/2008 | Bockel et al. | |
| 7,387,033 B2 | 6/2008 | Qing et al. | |
| 7,387,907 B2 | 6/2008 | Hsu et al. | |
| 7,427,806 B2 | 9/2008 | Arndt et al. | |
| 7,485,818 B2 | 2/2009 | Chou | |
| 7,510,888 B2 | 3/2009 | Guenther et al. | |
| 7,514,666 B2 | 4/2009 | Yee et al. | |
| 7,582,513 B2 | 9/2009 | Kroeninger et al. | |
| 7,675,132 B2 | 3/2010 | Waitl et al. | |
| 7,755,029 B2 | 7/2010 | Tang et al. | |
| 7,767,485 B2 | 8/2010 | Ogawa et al. | |
| 7,851,246 B2 | 12/2010 | Camacho | |
| 8,026,472 B2 | 9/2011 | Arnold | |
| 8,031,174 B2 | 10/2011 | Hamblin et al. | |
| 8,097,852 B2 | 1/2012 | Yao | |
| 8,143,608 B2 | 3/2012 | Yao et al. | |
| 8,207,517 B2 | 6/2012 | Wang et al. | |
| 8,275,922 B2 | 9/2012 | Barrett et al. | |
| 8,420,999 B2 | 4/2013 | Costello et al. | |
| 8,575,537 B2 | 11/2013 | Yao et al. | |
| 2002/0172472 A1* | 11/2002 | Nelson et al. | 385/88 |
| 2004/0065894 A1 | 4/2004 | Hashimoto et al. | |
| 2005/0088900 A1 | 4/2005 | Chan | |
| 2005/0110157 A1 | 5/2005 | Sherrer et al. | |
| 2005/0199786 A1 | 9/2005 | Yoshida et al. | |
| 2006/0016994 A1 | 1/2006 | Basoor et al. | |
| 2006/0017069 A1* | 1/2006 | Bergmann et al. | 257/212 |
| 2006/0022212 A1 | 2/2006 | Waitl et al. | |
| 2006/0022215 A1 | 2/2006 | Arndt et al. | |
| 2006/0045530 A1 | 3/2006 | Lim et al. | |
| 2006/0049533 A1 | 3/2006 | Kamoshita | |
| 2006/0118807 A1 | 6/2006 | Ives et al. | |
| 2007/0045524 A1 | 3/2007 | Rains et al. | |
| 2007/0072321 A1 | 3/2007 | Sherrer et al. | |
| 2007/0085157 A1 | 4/2007 | Fadell | |
| 2007/0246646 A1 | 10/2007 | Lum et al. | |
| 2008/0006762 A1* | 1/2008 | Fadell et al. | 250/201.1 |
| 2008/0011939 A1* | 1/2008 | Yee et al. | 250/214 AL |
| 2008/0011940 A1 | 1/2008 | Zhang et al. | |
| 2008/0012033 A1 | 1/2008 | Arndt | |
| 2008/0030878 A1 | 2/2008 | Saxena et al. | |
| 2008/0049210 A1 | 2/2008 | Takaoka | |
| 2008/0116379 A1* | 5/2008 | Teder | 250/341.1 |
| 2008/0118241 A1 | 5/2008 | TeKolste et al. | |
| 2008/0165115 A1 | 7/2008 | Herz et al. | |
| 2008/0173790 A1 | 7/2008 | Cheng et al. | |
| 2008/0173963 A1 | 7/2008 | Hsu et al. | |
| 2008/0197376 A1 | 8/2008 | Bert et al. | |
| 2008/0223934 A1 | 9/2008 | Havens | |
| 2008/0265266 A1 | 10/2008 | Bogner et al. | |
| 2008/0296478 A1 | 12/2008 | Hernoult | |
| 2008/0308738 A1 | 12/2008 | Li et al. | |
| 2008/0308917 A1 | 12/2008 | Pressel et al. | |
| 2009/0027652 A1 | 1/2009 | Chang et al. | |
| 2009/0057799 A1 | 3/2009 | Chan et al. | |
| 2009/0101804 A1* | 4/2009 | Phan Le | 250/221 |
| 2009/0129783 A1 | 5/2009 | Ori et al. | |
| 2009/0159900 A1 | 6/2009 | Basoor | |
| 2009/0168088 A1 | 7/2009 | Rosenblatt | |
| 2009/0267173 A1 | 10/2009 | Takahashi et al. | |
| 2010/0030039 A1 | 2/2010 | Lamego et al. | |
| 2010/0246771 A1 | 9/2010 | Hawver et al. | |
| 2010/0282951 A1 | 11/2010 | Costello et al. | |
| 2010/0327164 A1 | 12/2010 | Costello et al. | |
| 2011/0024627 A1 | 2/2011 | Yao | |
| 2011/0057102 A1 | 3/2011 | Yao | |
| 2011/0057104 A1 | 3/2011 | Yao et al. | |
| 2011/0057128 A1 | 3/2011 | Guenter et al. | |
| 2011/0057129 A1 | 3/2011 | Yao | |
| 2011/0121181 A1 | 5/2011 | Costello | |
| 2011/0204233 A1 | 8/2011 | Costello et al. | |
| 2011/0297831 A1 | 12/2011 | Yao et al. | |
| 2012/0070145 A1 | 3/2012 | Wong et al. | |
| 2012/0160994 A1 | 6/2012 | Costello et al. | |

FOREIGN PATENT DOCUMENTS

| | | |
|---|---|---|
| EP | 1455564 | 9/2004 |
| GB | 2486000 | 6/2012 |
| JP | 63308973 | 12/1988 |
| WO | WO-2006045531 | 5/2006 |
| WO | WO-2009/072786 | 6/2009 |
| WO | WO-2009072786 | 6/2009 |
| WO | WO-2012068213 | 5/2012 |

OTHER PUBLICATIONS

Avago Technologies, "APDS-9101—Integrated Reflective Sensor", Data Sheet 2007.

Avago Technologies, "HSDL-9100—Surface-Mount Proximity Sensor", Data Sheet 2006.

Costello, et al., "U.S. Appl. No. 12/495,739", Optical Proximity Sensor Package with Molded Infrared Light Rejection Barrier and Infrared Pass Components Jun. 30, 2009.

Ides—The Plastic Web, "Si Photo Diode Chip", Dec. 19, 2007.

Losee, et al., "A ⅓ Format Image Sensor with Refractory Metal Light Shield for Color Video Applications", Solid State Circuits Conference, Digest of Technical Papers, 36th ISSCC, IEEE International Volume. Feb. 1989 , 90-91.

Tan, et al., "U.S. Appl. No. 12/623,767", Infrared Proximity Sensor Package with Improved Crosstalk Isolation, filed Nov. 23, 2009, 30 pages.

Tyntek, "Data Sheet for AlGaAs/GaAs Infrared Chip", TK 114IRA Mar. 2004.

Tyntek, "Si Photo-Diode Chip—TK043PD Data Sheet", Dec. 19, 2007.

Xydar, "G-930—Solvay Advanced Polymers—Liquid Crystal Polymer Data Sheet", reproduced from website at www.ides.com/grades/ds/E22219.htm on Dec. 17, 2007.

Penchem Technologies Data Sheet for Penchem OP 580—IR Filter Optoelectronic Epoxy, Apr. 2009.

Penchem Technologies Data Sheet for Penchem OP 579—IR Pass Optoelectronic Epoxy, Apr. 2009.

Avago Technologies APDS-9120 Integrated Optical Proximity Sensors Prelim Datasheet, Feb. 25, 2009.

Avago Technologies APDS-9800 Integrated Ambient Light and Proximity Sensor Prelim Datasheet, Mar. 2, 2009.

Avago Technologies APDS-9700 Signal Conditioning IC for Optical Proximity Sensors, Jan. 4, 2008.

Avago Technologies APDS-9005 Miniature Surface-Mount Ambient Light Photo Sensor, Jan. 164, 2007.

Data Sheet for TYTEK AlGaAs/GaAs Infrared Chip—TK116IRA, Nov. 2008.

"Infra-Red Proiximiity Sensor (II)," Ibrahim Khamal. Apr. 4, 2008.

"Device Debuts as the World's Best-Performing Integrated Light/Proximity Sensor," AZ Optics, Nov. 11, 2008.

"A4 Masking Sheet—A4 Masking Sheet", Downloaded from website: <http://www.stix2.com.au/a4-masking-sheet-13/a4-masking-sheet.html> 2012, *Product Description* 2012.

"Altera 40/100 Gigabit Ethernet", *Altera Corporation Product Sheet* Copyright 1995-2012, 3 pages 2012.

"Altera's 10-Gbps Ethernet (XAUI) Solution", *Altera Corporation Product Sheet* , Copyright 1995-2012, 2 pages 2012.

"Nordson Ink-Dot I.D. System", *Nordson Corporation Product Sheet 2012*, 2 pages 2012.

(56) References Cited

OTHER PUBLICATIONS

"SerialLite II Protocol", *Altera Reference Manual* Oct. 2005, 84 pages 2005.

Morgavi, Paul , "Panasonic Print Head Technology and Market Applications", *IMI Europe, Digital Printing Conferences 2007, Presentation*, Nov. 7 to 9, 2007, 24 pages 2007.

"Agilent HSDL-9100 Miniature Surface-Mount Proximity Sensor Data Sheet", Dec. 21, 2007.

"APDS-9900 and APDS-9901 Digital Proximity and Ambient Light Sensor", Mar. 23, 2011.

Avago Technologies, "Avago Technologies Announces Ultra-Thin Integrated Ambient Light and Proximity Sensor Module for Use in Mobile Phones", *Wireless Design and Development* Nov. 27, 2009.

Avago Technologies, , "Integrated Optical Proximity Sensors", *APDS 9120, Data Sheet* Mar. 3, 2009.

Ishihara, et al., "A Dual Face Package Using a Post with Wire Components: Novel Structure for PoP Wafer Level CSP and Compact Image Sensor Package", *Electronic Components and Technology Conference* 2008, 1093-1098.

Tyntek, "Data Sheet for Si Photo-diode Chip", TK 043PD Jun. 2004.

\* cited by examiner

Prior Art

COMPACT OPTICAL PROXIMITY SENSOR WITH BALL GRID ARRAY AND WINDOWED SUBSTRATE

FIELD OF THE INVENTION

Various embodiments of the inventions described herein relate to the field of proximity sensors, and components, devices, systems and methods associated therewith.

BACKGROUND

Optical proximity sensors, such as the AVAGO TECHNOLOGIES™ HSDL-9100 surface-mount proximity sensor, the AVAGO TECHNOLOGIES™ APDS-9101 integrated reflective sensor, the AVAGO TECHNOLOGIES™ APDS-9120 integrated optical proximity sensor, and the AVAGO TECHNOLOGIES™ APDS-9800 integrated ambient light and proximity sensor, are known in the art. Such sensors typically comprise an integrated high efficiency infrared emitter or light source and a corresponding photodiode or light detector, and are employed in a large number of hand-held electronic devices such as mobile phones, Personal Data Assistants ("PDAs"), laptop and portable computers, portable and handheld devices, amusement and vending machines, industrial automation machinery and equipment, contactless switches, sanitary automation machinery and equipment, and the like.

Figure 1:
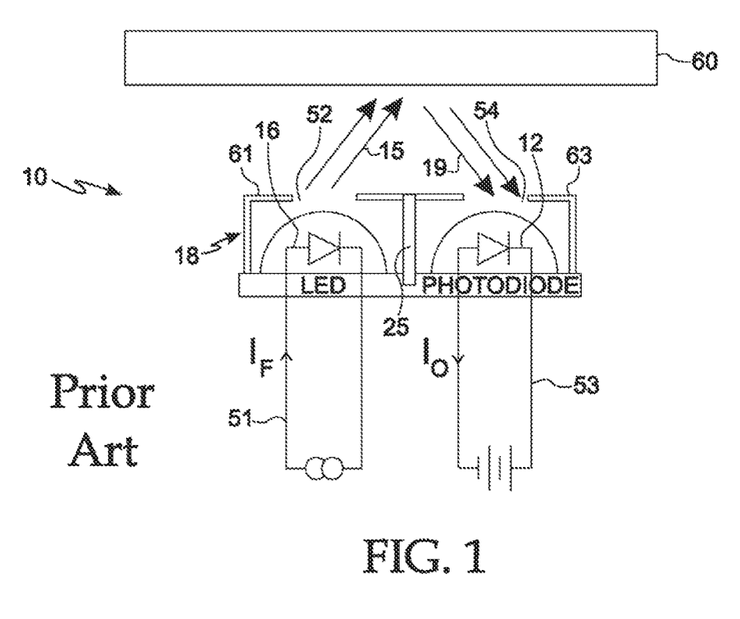
FIG. 1 shows a prior art optical proximity sensor and associated circuitry.

Referring to FIG. 1, there is shown a prior art optical proximity sensor 10 comprising infrared light emitter 16, light emitter driving circuit 51, light detector or photodiode 12, light detector sensing circuit 53, metal housing or shield 18 with apertures 52 and 54, and object to be sensed 60. Light rays 15 emitted by emitter 16 and reflected as light rays 19 from object 60 (which is in relatively close proximity to optical proximity sensor 10) are detected by photodiode 12 and thereby provide an indication that object 60 is close or near to sensor 10.

As further shown in FIG. 1, optical proximity sensor 10 further comprises metal housing or shield 18 formed of metal and comprising apertures 52 and 54 located over light emitter 16 and light detector 12, respectively, such that at least a first portion of light 15 emitted by light detector 12 passes through aperture 55, and at least a second portion of the first portion 19 of light reflected from object 50 in proximity to sensor 10 passes through aperture 57 for detection by light detector 12. As shown, metal housing or shield 18 may further comprise first and second modules 61 and 63 within which light emitter 16 and light detector 12 are disposed, respectively. The first and second modules 61 and 63 comprise adjoining optically opaque metal inner sidewalls 25 to provide optical isolation between first and second modules 61 and 63.

Many optical proximity sensors generally include a metal shield, such as shield or housing 18 of the type shown in FIG. 1, to provide optical isolation between light emitter 16 and light detector or photodiode 12 so that undesired optical cross-talk between emitter 16 and detector 12 is minimized. See, for example, the Data Sheets corresponding to the AVAGO TECHNOLOGIES™ APDS-9120 Integrated Optical Sensors Preliminary Datasheet and the AVAGO TECHNOLOGIES™ APDS-9800 Integrated Ambient Light and Proximity Sensors Preliminary Datasheet, each of which is hereby incorporated by reference herein, each in its respective entirety.

Figure 2:
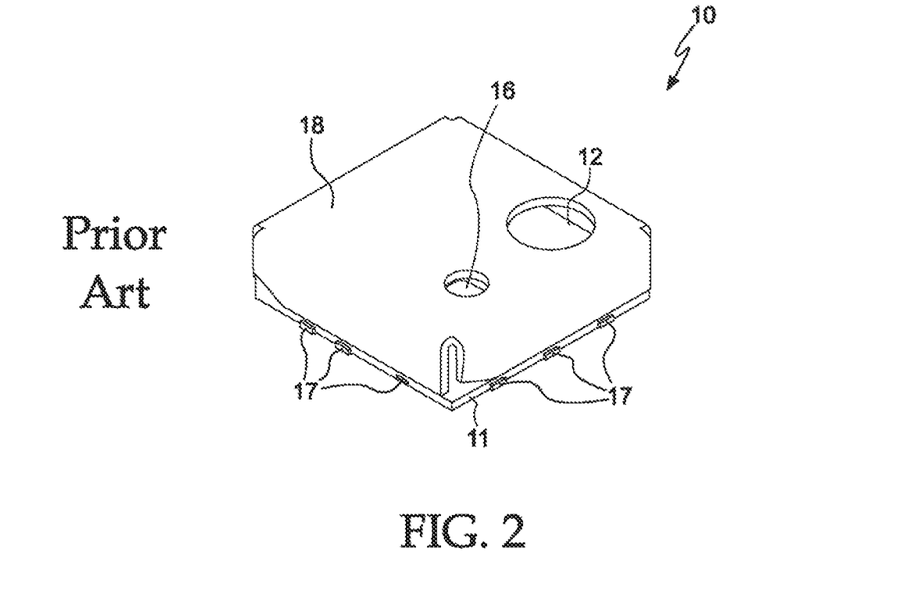
FIG. 2 shows a prior art optical proximity sensor with a metal shield or housing.

FIG. 2 shows a prior art optical proximity sensor 10 with metal shield or housing 18. The optical proximity sensor shown in FIG. 2 is an AVAGO TECHNOLOGIES™ APDS-9120 Integrated Optical Proximity Sensor, which contains a molded plastic substrate 11 upon which are mounted LED 16 and light detector or photodiode 12. Single-piece metal shield 18 covers LED 16 and light detector or photodiode 12 and contains a downwardly projecting light barrier 65 disposed therebetween (not shown in FIG. 2). Electrical contacts 17 provide a means to establish electrical connections between proximity sensor 10 and external devices. In the APDS-9120 optical proximity sensor, metal shield 18 is formed and thinned using conventional metal stamping techniques, and is affixed to the underlying plastic substrate 11 by gluing. The APDS-9120 sensor has an areal footprint of only 4 mm by 4 mm, and thus is quite small.

Figure 3:
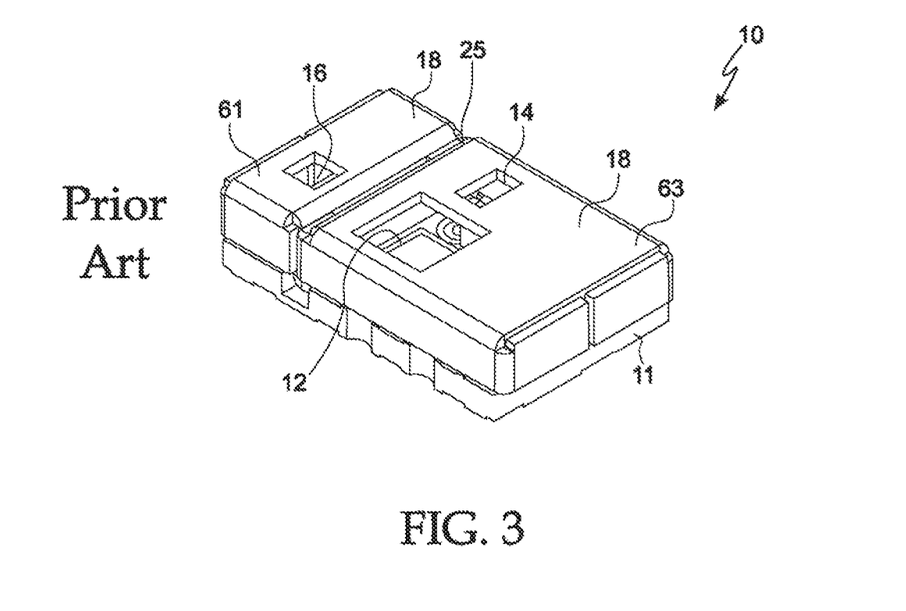
FIG. 3 shows a prior art optical proximity sensor with a more complicated metal shield or housing than that shown in FIG. 2.

FIG. 3 shows a prior art optical proximity sensor 10 with a more complicated metal shield or housing 18 than that of FIG. 2. The optical proximity sensor shown in FIG. 3 is an AVAGO TECHNOLOGIES™ APDS-9800 Integrated Ambient Light and Proximity Sensor, which contains a printed circuit board ("PCB") substrate 11 upon which are mounted LED 16, light detector or photodiode 12, and ambient light sensor 14. The two-piece metal shield 18 covers LED 16, light detector or photodiode 12, and ambient light sensor 14 and contains a downwardly projecting light barrier 65 disposed therebetween. In the APDS-9800 optical proximity sensor, metal shield 18, being of a considerably more complicated shape and geometry than that of FIG. 2, is formed and thinned using more advanced progressive metal stamping techniques, and must be hand-fitted and attached to the underlying PCB by gluing to ensure proper alignment and fit.

As will now be seen, at least some optical proximity sensors of the prior art rely upon the use of an externally mounted metal shield 18, which is required to reduce the amount of crosstalk or interference that might otherwise occur between LED 16 and light detector 12, as well as to help increase the detection distance of the device. Metal shields 18 are quite small, however, making them difficult to manufacture in high volumes, and thus expensive to fabricate. Such metal shields 18 also generally require expensive automated equipment to attach same to sensors 10 in a mass production setting. Moreover, the quality of metal shields 18 often varies, and issues commonly arise with suppliers being unable to meet the tight dimensional tolerances required for such small devices. Metal shields 18 can also detach from sensor 10, thereby adding another failure point for sensor 10.

In addition, the commercial marketplace demands ever smaller portable electronic devices. This of course means there exists a motivation to make optical proximity sensors ever smaller. As optical proximity sensors become smaller, it becomes increasingly difficult to manufacture and attach the aforementioned metal shields to the sensors in a mass production setting. The metal shields themselves also add to the bulk and volume of the resulting sensor or package.

What is need is an optical proximity sensor design that eliminates the need to include a metal shield 18, but which retains high crosstalk and interference rejection characteristics so that an optical proximity sensor can be provided that features improved performance, lower cost, increased manufacturability and improved reliability. What is also needed is a smaller optical proximity sensor.

SUMMARY

In some embodiments, there is provided an optical proximity sensor comprising a printed circuit board ("PCB") substrate comprising an aperture and a lower surface having electrical contacts disposed thereon, an infrared light emitter and an infrared light detector mounted on an upper surface of the substrate, an integrated circuit located at least partially within the aperture, a molding compound being disposed between portions of the integrated circuit and substrate, an ambient light detector mounted on an upper surface of the integrated circuit, first and second molded infrared light pass components disposed over and covering the infrared light emitter and the infrared light detector, respectively, and a molded infrared light cut component disposed between and over portions of the first and second infrared light pass components.

In other embodiments, there is provided a method making an optical proximity sensor comprising providing a printed circuit board ("PCB") substrate comprising an aperture and a lower surface having electrical contacts disposed thereon, mounting an infrared light emitter and an infrared light detector on an upper surface of the substrate, positioning an integrated circuit at least partially within the aperture, placing a molding compound between portions of the integrated circuit and substrate, mounting an ambient light detector on an upper surface of the integrated circuit, molding first and second infrared light pass components over and covering the infrared light emitter and the infrared light detector, respectively, and molding an infrared light cut component between and over portions of the first and second infrared light pass components.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTIONS OF SOME PREFERRED EMBODIMENTS

Figure 4:
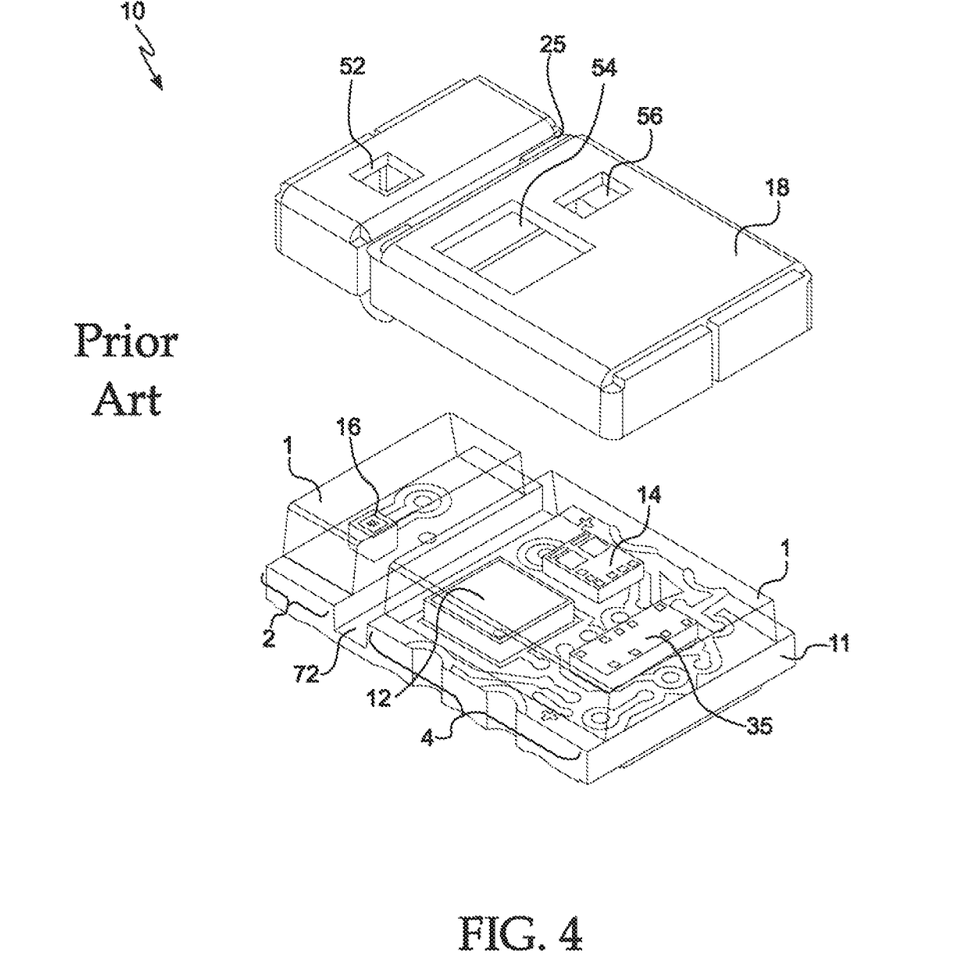
FIG. 4 shows another prior art optical proximity sensor with a metal shield or housing.

Referring to FIG. 4, there is shown a conventional optical proximity sensor known in the prior art which comprises substrate 11 and metal shield 18. Integrated circuit 35, ambient light detector 14, infrared light detector 12 and infrared light emitter 16 are mounted on substrate 11. Optically transmissive molding material 1 is molded over integrated circuit 35, ambient light detector 14, infrared light detector 12 and infrared light emitter 16. Slot 72 separates first portion of substrate 11 from second portion of substrate 11. When metal shield 18 is placed over and attached to the lower assembly containing substrate 11, integrated circuit 35, ambient light detector 14, infrared light detector 12 and infrared light emitter 16, barrier 25 fits within slot 72 and inhibits the transmission of light originating from infrared light emitter 16 from reaching infrared light detector 12. Optical proximity sensor 10 shown in FIG. 4 suffers form many of the problems and drawbacks discussed above in connection with the prior art devices shown in FIGS. 1 through 3.

Figure 5:
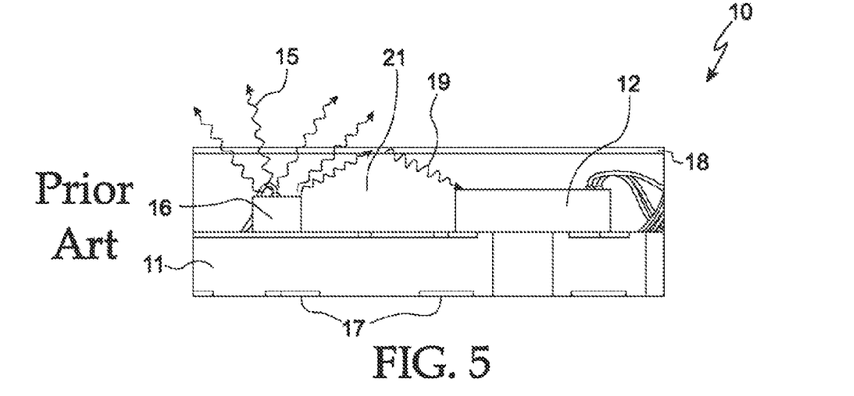
FIG. 5 shows an optical proximity sensor comprising a light emitter mounted on a substrate and separated from a light detector by an optically transmissive material.

FIG. 5 shows an optical proximity sensor 10 comprising light emitter 16 mounted on substrate 11 and separated from light detector 12 by optically transmissive material 21, which is a single mold two-part epoxy or transfer molding compound. As shown in FIG. 4, while light rays 15 are transmitted through material 21, other reflected, diffracted or refracted IR radiation 19 can leak across to light detector 12 through single mold compound 21, which manifests itself as undesired crosstalk or interference between light emitter 16 and light detector 12, thereby degrading the performance of proximity sensor 10.

Figure 6:
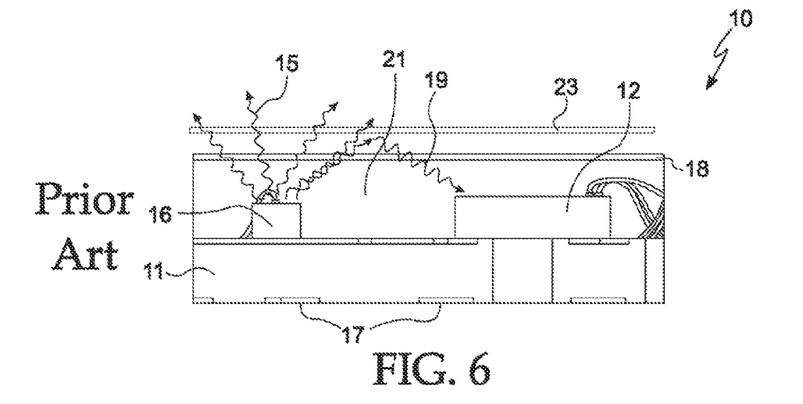
FIG. 6 shows an optical proximity sensor comprising a light emitter mounted on a substrate and separated from a light detector by an optically transmissive material, and a window disposed above the optical proximity sensor.

As further shown in FIG. 6, the amount of reflected, diffracted or refracted IR radiation 19 and undesired crosstalk or interference between light emitter 16 and light detector 12 is typically exacerbated by the presence of window 23, which in some applications is provided as part of the portable or other type of electronic device in which proximity sensor 10 is housed and mounted.

Figure 7:
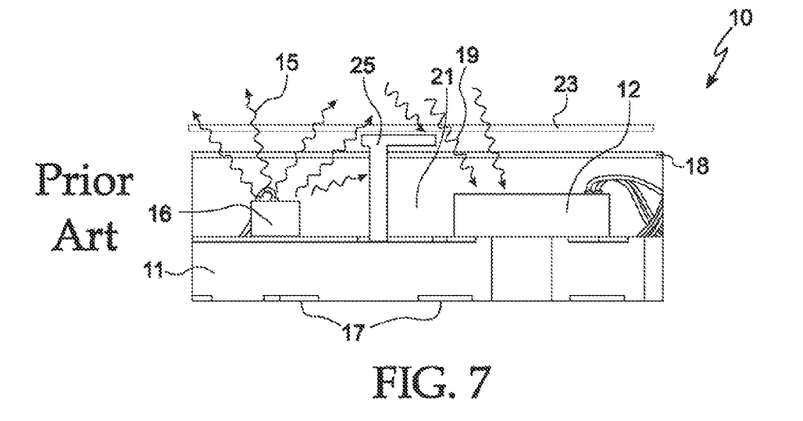
FIG. 7 shows an optical proximity sensor comprising a light emitter mounted on a substrate and separated from a light detector by a metal light barrier.

As shown in FIG. 7, the problems arising from undesired crosstalk or interference caused by reflected, diffracted or refracted IR radiation 19 may be reduced by disposing a metal light barrier 25 between light emitter 16 and light detector 12.

Providing such a metal barrier 25 in proximity sensor 10, however, presents problems respecting increased manufacturing costs and complexity.

Figure 16:
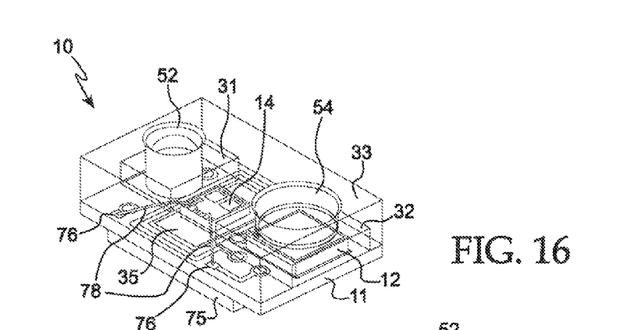
FIG. 16 shows the optical proximity sensor and substrate with an infrared light cut component molded over the first and second infrared light pass components.
Figure 17:
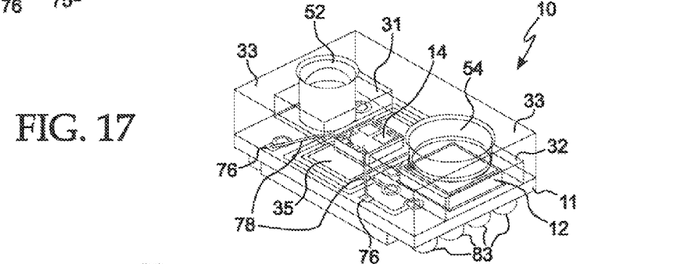
FIG. 17 shows the optical proximity sensor of FIG. 16 with solder balls attached to electrical contacts disposed on the bottom of the sensor.
Figure 18:
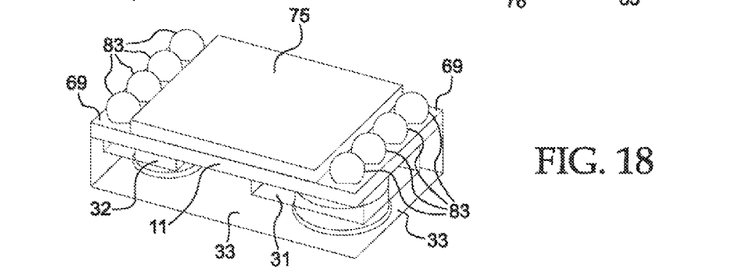
FIG. 18 shows a bottom perspective view of the optical proximity sensor of FIG. 17.
Figure 19:
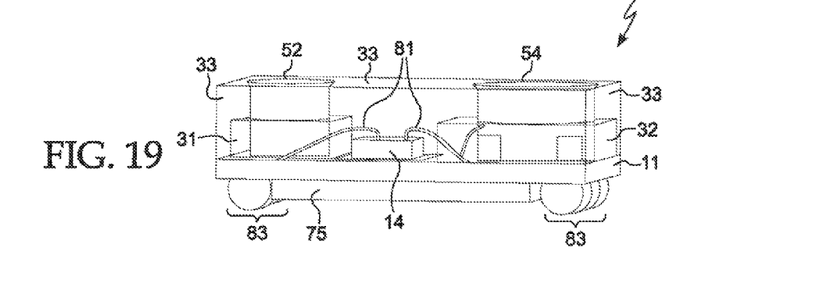
FIG. 19 shows a side view of the optical proximity sensor of FIG. 17.

Referring now to FIGS. 8 through 19, there is shown one embodiment of optical proximity sensor 10 and its various components during various stages of assembly. The complete optical proximity sensor of such an embodiment is shown in FIGS. 17, 18 and 19. As will become apparent, the embodiment of optical proximity sensor 10 shown in FIGS. 17, 18 and 19 overcomes many of the problems associated with prior art optical proximity sensors by completely eliminating the need for a metal shield, reducing the overall size, volume and footprint of optical proximity sensor 10, and reducing manufacturing and material costs associated therewith. Many other advantages of the embodiment of the optical proximity sensor 10 illustrated in FIGS. 8 through 19 will become apparent to those skilled in the art upon having read, understood and considered the present specification and drawings.

Figures 8, 9, 10:
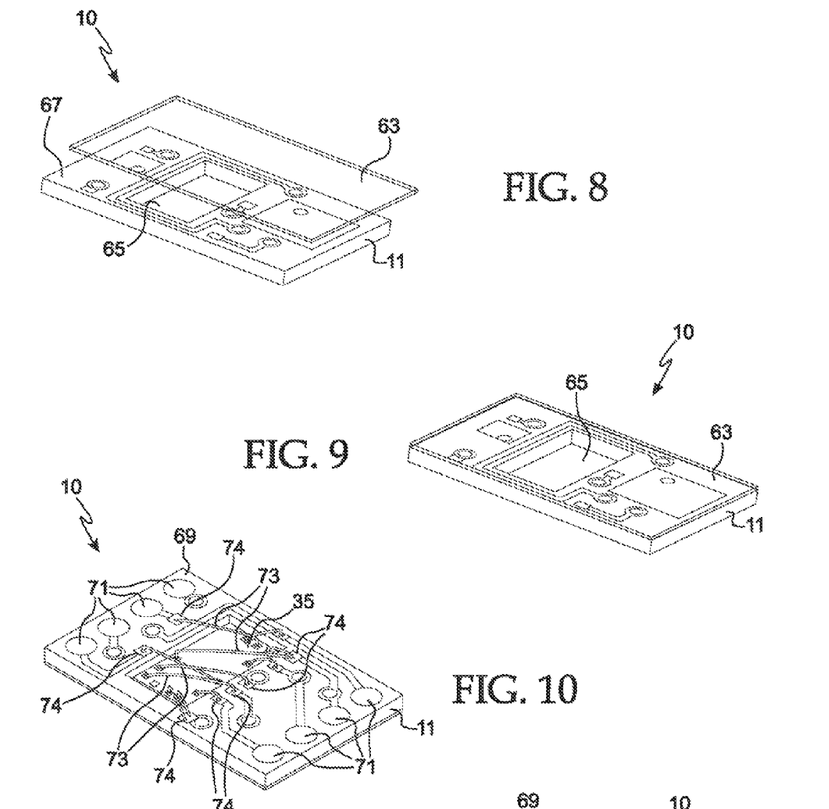
FIG. 8 shows a top perspective view of a substrate prior to having tape disposed over an aperture thereof.
FIG. 9 shows the substrate of FIG. 8 with the tape attached thereto.
FIG. 10 shows the substrate of FIG. 9 with an integrated circuit disposed in the aperture.

Referring now to FIG. 8, there is shown a printed circuit board ("PCB") substrate 11 having central aperture 65 formed therethrough. Tape 63 having a lower sticky or adhesive surface is placed over upper surface 67 of substrate 11 and attached temporarily thereto as shown in FIG. 9. Next, substrate 11 is flipped over and integrated circuit 35, which is preferably configured to fit conformably within aperture 65, is placed within aperture 65 such that an upper thereof engages and is held in contact with the sticky or adhesive lower surface of tape 63. In such a manner, integrated circuit 35 is held within aperture 35 while wires 73 are bonded to integrated circuit 35 and corresponding wire bond pads 74 disposed on lower surface 69 of substrate 11.

Note that while in one embodiment substrate 11 comprises conventional PCB materials and structure, substrate 11 may also comprise any one or more of KAPTON™, fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, and plastic. In one embodiment substrate 11 is a printed circuit board having traces, wire bond pads and/or vias disposed thereon or therein.

Figure 11:
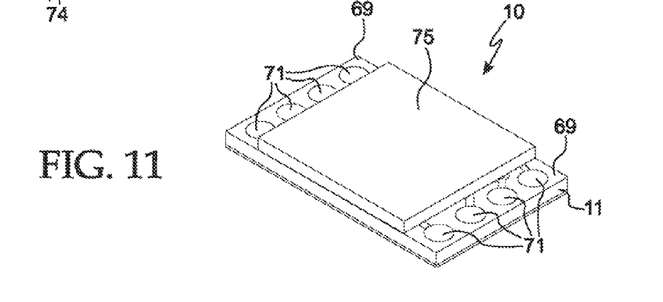
FIG. 11 shows a bottom perspective view of the substrate with a bottom portion of the integrated circuit encapsulated in a molding compound.

FIG. 11 shows proximity sensor 10 after bottom portions of integrated circuit 35 and corresponding wires 73 and wire bond pads 74 have been encapsulated, overmolded or covered with appropriate molding compound 75 such as DuPont™ KAPTON™ polyimide, epoxy, plastic, a polymer or any other suitable molding compound. Molding compound 75 covers and protects the underside of integrated circuit 35 and the various electrical connections located thereon, and additionally fixedly or rigidly attached integrated circuit 35 to the underside of substrate 11.

Figure 12A:
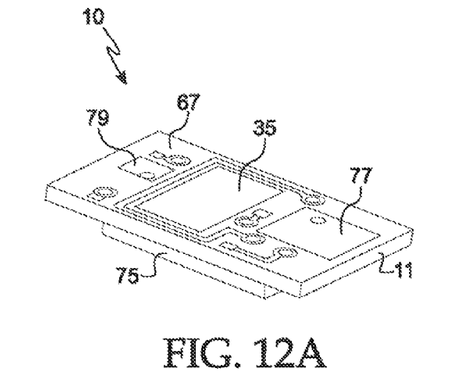
FIG. 12A shows a top perspective view of the substrate of FIG. 11.
Figure 12B:
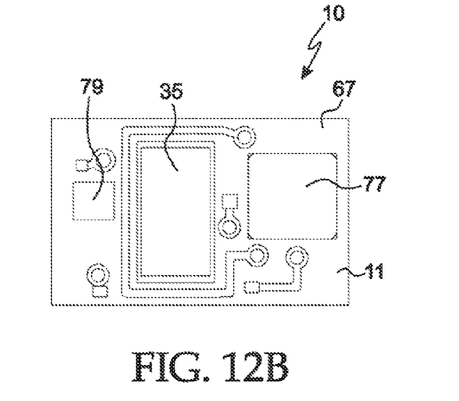
FIG. 12B shows a top plan view of the substrate of FIG. 12A.
Figure 13:
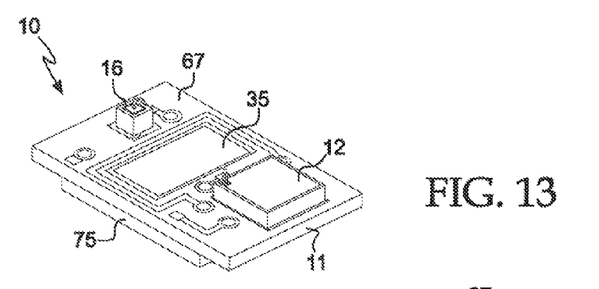
FIG. 13 shows the substrate with a light emitter and light detector mounted thereon.

FIGS. 12A and 12B show top perspective and top plan views of substrate 11 of optical proximity sensor 10 after tape 63 has been removed or delaminated from upper surface 67. As shown, an upper surface of integrated circuit 35 is flush with upper surface 67 of substrate 11. Because integrated circuit 35 is located within aperture 65 of substrate 11 and is not mounted atop substrate 11 in conventional fashion, substantial volume reduction is achieved in proximity sensor 10 with respect to prior art devices. As further shown in FIGS. 12A and 12B, upper surface 67 of substrate 11 has mounting pads or regions 77 and 79 formed thereon, which are configured to receive infrared light detector 12 and infrared light emitter 16 thereon, respectively. FIG. 13 shows substrate 11 and optical sensor 10 after infrared light detector 12 and infrared light emitter 16 have been die-attached or otherwise mounted on pads or regions 77 and 79, respectively, which is most preferably accomplished using electrically conductive epoxy, more about which is said below.

Figures 14, 15:
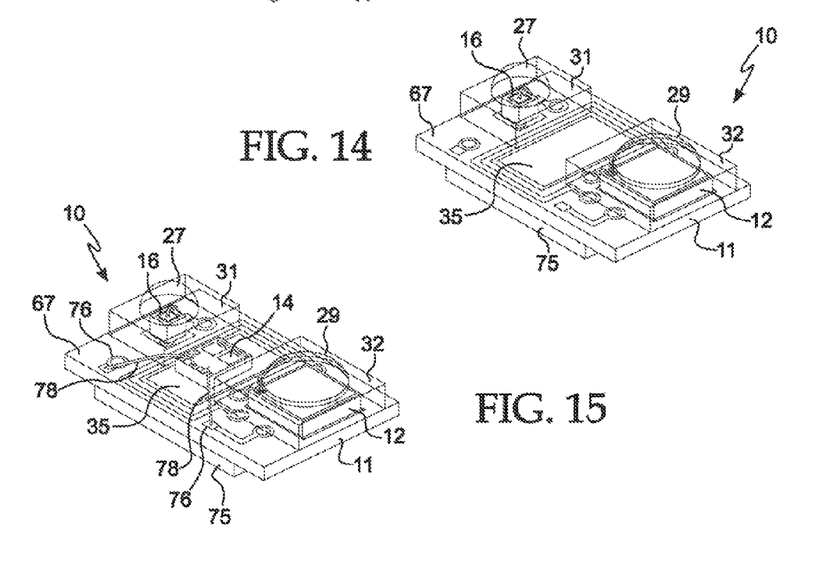
FIG. 14 shows the optical proximity sensor and substrate with first and second infrared light pass components molded over the light emitter and light detector, respectively.
FIG. 15 shows the optical proximity sensor and substrate with an ambient light detector mounted atop the integrated circuit.

FIG. 14 shows substrate 11 and optical proximity sensor 10 after first and second infrared pass, optically transmissive, or optically clear components, compounds or materials 31 and 32 have been molded over infrared light emitter 16 and infrared light detector 12, respectively. Note that lenses 27 and 29 may also be formed over infrared light emitter 16 and infrared light detector 12 during the overmolding process, where lenses 27 and 29 are configured to increase the efficiency of collimating outwardly transmitted or received light, as the case may be. While first and second infrared pass components 31 and 32 are most preferably formed using transfer molding techniques, other suitable molding techniques may also be employed such as compression molding methods. Following molding of components 31 and 32, infrared light pass components 31 and 32 are cured.

FIG. 15 shows optical proximity sensor 10 after ambient light detector 14 has been die-attached to the upper surface of integrated circuit, and after wires 78 have been wire bonded to ambient light detector 14 and wire bond pads 76 on substrate 11. Die attachment of ambient light detector 14 is most preferably accomplished using electrically conductive epoxy, more about which is said below.

Referring now to FIG. 16, there is shown optical proximity sensor 10 after infrared cut optically non-transmissive component, compound or material 33 has been molded between first and second infrared pass components 31 and 32 and between infrared light emitter 16 and infrared light detector 12, as well as over portions first and second infrared pass components 31 and 32 such that apertures 52 and 54 are formed in component 33. After molding, infrared light cut component, compound or material 33 is cured. Infrared light cut component 33 is configured to permit a first portion of light emitted by light emitter 16 to pass through infrared light pass component 31 and first aperture 52 such that at least a second portion of the first portion of light reflected from an object of interest in proximity to sensor 10 passes through second aperture 54 and infrared light pass component 31 for detection by infrared light detector 12. Infrared light cut component 33 is further configured to be disposed between infrared light emitter 16 and infrared light detector 12 in each of devices 10 so as to substantially attenuate or block the transmission of undesired direct, scattered or reflected light between infrared light emitter 16 and infrared light detector 12 and thereby minimize optical crosstalk and interference between infrared light emitter 16 and infrared light detector 12.

FIGS. 17, 18 and 19 show top perspective, bottom perspective and side view, respectively, of optical proximity sensor 10 after ball grid array 83 has been attached to the underside of sensor 10 on electrical contacts 71 (see, for example, FIGS. 10 and 11). Optical proximity sensor 10 is now ready for mounting to another device, and for establishing electrical interconnection therewith, through ball grid array 83 in a manner well known in the art.

According to one embodiment, light emitter 16 is a semiconductor infrared LED such as a Model No. TK116IRA TYNTEK™ AlGaAs/GaAs Infrared Chip, the data sheet for which is included in an Information Disclosure Statement filed on even date herewith and the entirety of which is hereby incorporated by reference herein. Light detector 12 may be, by way of example, a TYNTEK™ Si Photo-diode Chip No, TK 043PD, the data sheet for which is hereby incorporated by reference herein in its entirety. Ambient light detector 14 may be, by way of example, an AVAGO TECHNOLOGIES™ APDS-9005 Miniature Surface-Mount Ambient Light Photo Sensor, the data sheet for which is hereby incorporated by reference herein in its entirety. Integrated circuit 35 may be, by way of example, an AVAGO TECHNOLOGIES™ APDS-9700 signal conditioning IC for optical proximity sensors, the data sheet for which is hereby incorporated by reference herein in its entirety.

Infrared light cut component 33 does not extend over apertures 52, 54 which are configured to permit the passage of direct, reflected and ambient light therethrough, respectively. Infrared light cut component 33 does extend and is molded between a first portion and a second portion of substrate 11 so as to attenuate or absorb undesired scattered, reflected or direct light rays that might otherwise propagate between light emitter 16 and light detectors 12 and 14. That is, infrared light cut component 33 is configured and molded to substantially attenuate or block the transmission of undesired direct, scattered or reflected light between light emitter 16 and light detector 12, and thereby minimize optical crosstalk and interference between light emitter 16 and light detector 12. Infrared light emitter 16 is operably connected to integrated circuit 35 and is driven by a light emitter driving circuit contained therein. Similarly, light detector 12 is operably connected to integrated circuit 35, which comprises a light detector circuit incorporated therein. Ambient light detector or sensor 14 is also operably connected to integrated circuit 35, which contains an ambient light sensing circuit incorporated therein.

Infra-red rays emitted by light emitter or LED 16 exit sensor 10 and return to light detector 12 as rays, thereby permitting detection of the nearby object that is to be detected. Light rays reflected from the surface of molded component 31 are blocked from reaching light detector 12 by molded substantially optically non-transmissive infrared light cut component 33. Light rays reflected from a window interposed between optical sensor 10 and object to be detected 60 are also blocked by molded substantially optically non-transmissive infrared light cut component 33. Total Internal Reflection between components 31 and 33 helps improve the performance of proximity sensor 10. As will now be seen, the embodiment of sensor 10 shown in FIGS. 8 through 19 eliminates the need to provide a metal shield, while improving the optical performance of sensor 10 by reducing crosstalk and interference, as undesired reflected, refracted or diffracted light rays cannot penetrate and travel through to light detectors 12 or 14.

According to one embodiment, molded optically transmissive infrared light pass component, compound or material is formed using an infrared-pass and optically transmissive transfer molding compound such as NITTO DENKO™ NT-8506 clear transfer molding compound 8506 or PENCHEM Technologies™ OP 579 infrared pass optoelectronic epoxy. Other suitable optically transmissive epoxies, plastics, polymers or other materials may also be employed. See Technical Data Sheet NT-8506 entitled "Clear Transfer Molding Compound NT-8506" dated 2001 and PENCHEM OP 579 IR Pass Optoelectronic Epoxy Data Sheet, Revision 1, dated April, 2009, both of which documents are hereby incorporated by reference herein, each in its respective entirety.

In one embodiment, molded substantially optically non-transmissive infrared light cut component 33 is formed using an infrared-blocking, filtering or cutting transfer molding compound such as NITTO DENKO™ NT-MB-IRL3801 two-part epoxy resin material or PENCHEM Technologies™ OP 580 infrared filter optoelectronic epoxy, either of which preferably contains an amount of an infrared cutting material that has been selected by the user to achieve acceptable infrared light blocking performance while minimizing the amount of such infrared cutting material employed to keep costs to a minimum. Other suitable optically non-transmissive epoxies, plastics, polymers or other materials may also be employed. See Technical Data Sheet NT-MB-IRL3801 published by DENKO™ dated 2008 and PENCHEM OP 580 IR Filter Optoelectronic Epoxy Data Sheet, Revision 1, dated April, 2009, both of which documents are hereby incorporated by reference herein, each in its respective entirety.

Figure 20:
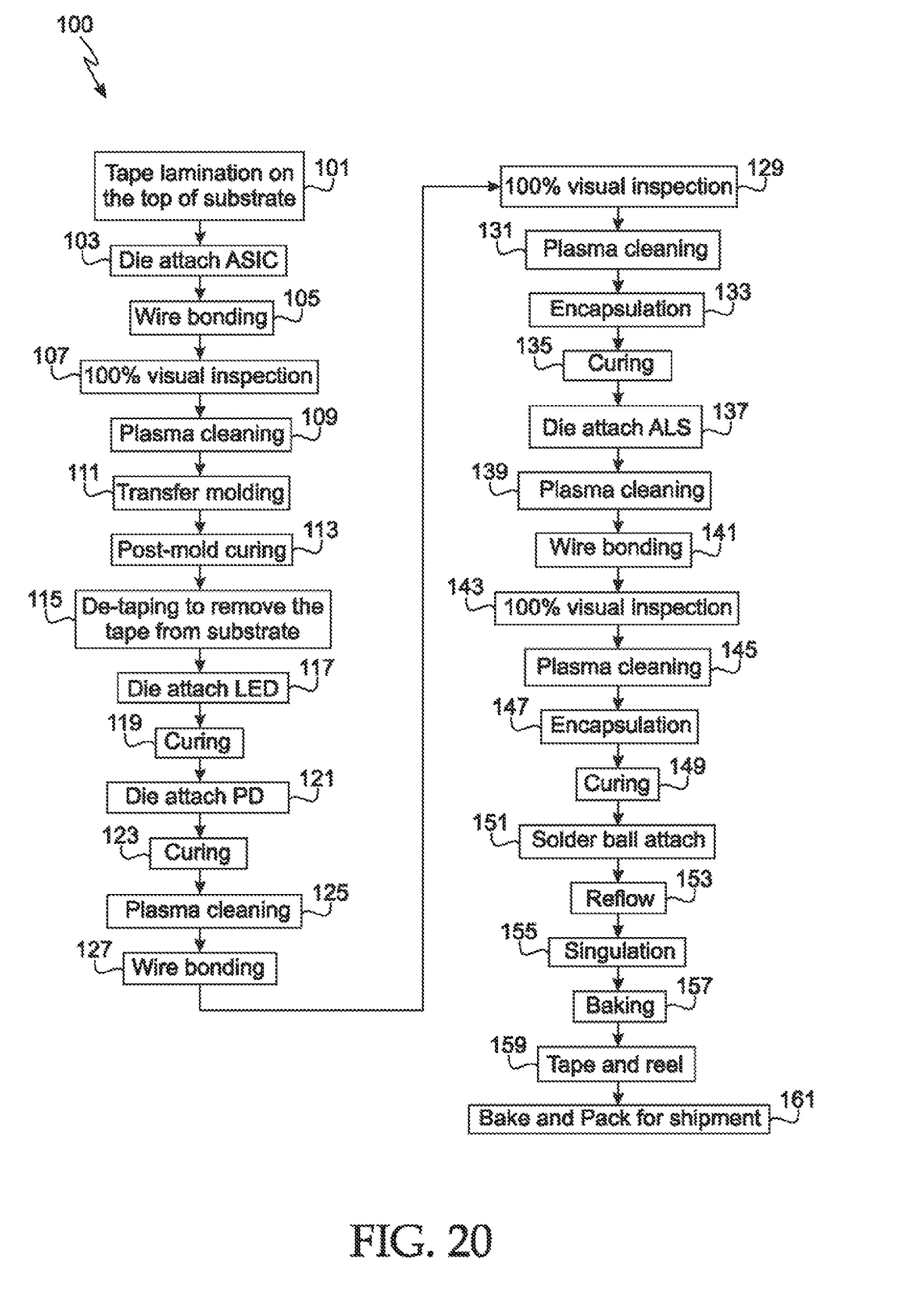
FIG. 20 illustrates a method of making an optical proximity sensor according to one embodiment.

Referring now to FIG. 20, there are shown steps corresponding to one embodiment of method 100 for making optical proximity sensor 10. As shown in FIG. 20, the assembly process begins at step 101 and by laminating tape 63 on upper surface 67 of substrate 11. Next, integrated circuit 35 (which in a preferred embodiment is an AVAGO TECHNOLOGIES™ 9700 ASIC) is die-attached to the adhesive underside of tape 63 at step 103 after being mounted in aperture 65. Wire bonding is then conducted at step 105 at a bonding temperature of 150 C. After wire bonding, 100% visual inspection is conducted at step 107 to verify the integrity and robustness of the connections established by wire bonding. After visual inspection at step 107, plasma cleaning step 109 is conducted.

First transfer molding process 111 is carried out using a black IR cut component, compound or material such as NT8570 at a molding temperature ranging between about 150 C and about 160 C. At step 113 post-mold curing is carried out at 150 C for about 3 hours. At step 115 laminating tape 63 is removed form substrate 11. In a die attachment process at step 117, infrared light emitter 16 (e.g., an LED TK116IR IC) is attached to substrates 11 using an electrically conductive epoxy such as FDP5053 or FDP5100, which is then cured at step 119 at 180 C for 30 minutes.

In a die attachment process at step 121, infrared light detector 12 (e.g., a PD-TK043PD IC) is attached to substrate 11 using an electrically conductive epoxy such as FDP5053 or FDP5100, which is then cured at step 123 at 180 C for 30 minutes. Next, at step 125 plasma cleaning is conducted to clean the surface of substrate 11, and especially the wire bonding surfaces thereof. Wire bonding is then conducted at step 127 at a bonding temperature of 150 C. After wire bonding, 100% visual inspection is conducted at step 129 to verify the integrity and robustness of the connections established by wire bonding. After visual inspection at step 129, a plasma cleaning step 131 is conducted.

At step 133, integrated circuit 35 is partially encapsulated by a clear transparent compound such as PT1002AB clear casting component, compound or material, followed by curing at step 135. Next, at step 137 ambient light detector 14 (which in a preferred embodiment is an AVAGO TECHNOLOGIES™ APDS-9005 Miniature Surface-Mount Ambient Light Photo Sensor) is die-attached to integrated circuit 35 using an electrically non-conductive epoxy such as ABLESTK™ 2025. Next, at step 139 plasma cleaning is conducted to clean the surface of substrates 11, and especially the wire bonding surfaces thereof. Wire bonding is then conducted at step 141 at a bonding temperature of about 150 C. After wire bonding, 100% visual inspection is conducted at step 143 to verify the integrity and robustness of the connections established by wire bonding. After visual inspection at step 143, a plasma cleaning step 145 is conducted.

At step 147, a second encapsulation process 147 is conducted using a clear IR cut casting component, compound or material such as NT-MB-IRL 3801 at a molding temperature ranging between about 150 C and about 160 C, followed by post-molding curing at step 149 at about 135 C for about 1 hour. At step 151 solder balls for ball grid array 83 are attached to electrical contacts 71 on the underside of optical proximity sensor 10. Solder reflow is then carried out at step 153, followed by singulation of individual packages or sensors 10. Baking is carried out at step 157 at about 150 C for about 30 minutes. Sensors 10 which have passed inspection and testing are packed onto a tape and reel at step 159 for baking and shipping at step 161.

Those skilled in the art will understand that many different variations in, and permutations or combinations of, the steps disclosed above can be made without departing from the scope of the invention such as by, for example, modifying steps, changing the order of steps, omitting steps, adding steps, and so on.

The transfer molding processes described above include methods where thermosetting materials are softened by heat and pressure in a transfer chamber, and then forced at high pressure through suitable sprues, runners, and gates into a closed mold for final curing.

Included within the scope of the present invention are methods of making and having made the various components, devices and systems described herein.

Those skilled in the art will understand that the various embodiments of the proximity sensor disclosed herein may be incorporated into portable electronic devices such as mobile telephones, smart phones, personal data assistants (PDAs), laptop computers, notebook computer, computers and other devices.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

Included within the scope of the present invention are methods of making and having made the various components, devices and systems described herein.

Those skilled in the art will understand that the various embodiments of the proximity sensor disclosed herein may be incorporated into portable electronic devices such as mobile telephones, smart phones, personal data assistants (PDAs), laptop computers, notebook computer, computers and other devices.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. An optical proximity sensor, comprising:
   a printed circuit board ("PCB") substrate comprising an upper surface, a lower surface having electrical contacts disposed thereon, and an aperture extending through the substrate from the upper surface to the lower surface;
   a light emitter and a light detector mounted on the upper surface of the substrate;
   an integrated circuit located at least partially within the aperture, a molding compound being disposed between portions of the integrated circuit and substrate, the integrated circuit having an upper surface and a lower surface, the upper surface of the integrated circuit being substantially flush with the upper surface of the substrate such that the upper surface of the integrated circuit is substantially flush with a bonding region configured to have a lower surface of the light emitter mounted thereto and a bonding region configured to have a lower surface of the light detector mounted thereto, the lower surface of the integrated circuit being configured to be wire bonded to the electrical contacts on the lower surface of the substrate, the molding compound being further configured to protect wire bonds between the lower surface of the integrated circuit and the electrical contacts on the lower surface of the substrate;
   an ambient light detector mounted on the upper surface of the integrated circuit;
   first and second molded light pass components disposed over and covering the light emitter and the light detector, respectively; and
   a molded light cut component disposed between and over portions of the first and second light pass components.

2. The optical proximity sensor of claim 1, wherein the light emitter and the light detector are mounted on the upper surface of the substrate on opposing sides of the aperture and wherein the molded light cut component at least partially contacts the upper surface of the integrated circuit.

3. The optical proximity sensor of claim 1, wherein the lower surface of the integrated circuit is overmolded with the molding compound.

4. The optical proximity sensor of claim 1, wherein the molding compound comprises an epoxy, plastic, a thermosetting plastic, a polymer or polyimide.

5. The optical proximity sensor of claim 1, wherein the substrate comprises fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, or plastic.

6. The optical proximity sensor of claim 1, wherein a ball grid array is mounted on the electrical contacts on the lower surface of the substrate.

7. The optical proximity sensor of claim 1, wherein the ambient light detector is electrically connected to the substrate by wires and wire bond pads.

8. The optical proximity sensor of claim 1, wherein at least a first portion of light emitted by the light emitter passes through the first component, and at least a second portion of the first portion of light reflected from an object of interest in proximity to the sensor passes through the second component for detection by the light detector.

9. The optical proximity sensor of claim 1, wherein the light cut component substantially attenuates or blocks the transmission of undesired direct, scattered or reflected light between the light emitter and the light detector thereby to minimize optical crosstalk and interference between the light emitter and the light detector.

10. The optical proximity sensor of claim 1, wherein at least one of the first and second light pass components comprises an optically transmissive epoxy, polymer or plastic.

11. The optical proximity sensor of claim 1, wherein the light cut component comprises a substantially optically non-transmissive moldable material, epoxy, polymer or plastic.

12. The optical proximity sensor of claim 1, wherein the light cut component further comprises a cut or blocking additive.

13. The optical proximity sensor of claim 1, wherein at least one of the light emitter and the light detector is a semiconductor die.

14. The optical proximity sensor of claim 1, wherein the substrate comprises at least one conductive via that electrically connects the lower surface of the integrated circuit to at least one of the light emitter and light detector.

15. The optical proximity sensor of claim 1, wherein the light emitter is an LED.

16. The optical proximity sensor of claim 1, wherein the light detector is a positive-intrinsic-negative ("PIN") diode.

17. The optical proximity sensor of claim 1, wherein a molded optically transmissive lens is formed over at least one of the light emitter and the light detector.

18. The optical proximity sensor of claim 1, wherein the optical proximity sensor is incorporated into a portable electronic device.

19. The optical proximity sensor of claim 18, wherein the portable electronic device is a mobile telephone, a personal data assistant (PDA), a laptop computer, a notebook computer, or a computer.

20. A method of making an optical proximity sensor, comprising:
    providing a printed circuit board ("PCB") substrate comprising an upper surface, a lower surface having electrical contacts disposed thereon, and an aperture extending through the substrate from the upper surface to the lower surface;
    mounting a light emitter and a light detector on the upper surface of the substrate;
    positioning an integrated circuit at least partially within the aperture such that an upper surface of the integrated circuit is substantially flush with the upper surface of the substrate as well as a lower surface of the light emitter and a lower surface of the light detector;
    bonding one or more wires between a lower surface of the integrated circuit and the electrical contacts on the lower surface of the substrate;
    placing a molding compound between portions of the integrated circuit and substrate, the molding compound also physically protecting the one or more wires that have been bonded between the lower surface of the integrated circuit and the electrical contacts on the lower surface of the substrate;
    mounting an ambient light detector on the upper surface of the integrated circuit;
    molding first and second light pass components over and covering the light emitter and the light detector, respectively; and
    molding a light cut component between and over portions of the first and second light pass components.

21. The method of claim 20, wherein the light emitter and the light detector are mounted on the upper surface of the substrate on opposing sides of the aperture and wherein one or more electrically-conductive vias in the substrate provide an electrical connection between the integrated circuit and at least one of the light emitter and the light detector.

22. The method of claim 20, wherein the lower surface of the integrated circuit is overmolded with the molding compound.

23. The method of claim 20, further comprising mounting a ball grid array on the electrical contacts on the lower surface of the substrate.

24. The method of claim 20, further comprising electrically connecting the ambient light detector to the upper surface of the substrate by wires and wire bond pads.

25. The method of claim 20, further comprising molding an optically transmissive lens over at least one of the light emitter and the light detector.

26. The method of claim 20, further comprising incorporating the optical proximity sensor into a portable electronic device.

* * * * *